(12) United States Patent
Misra et al.

(10) Patent No.: US 6,461,225 B1
(45) Date of Patent: Oct. 8, 2002

(54) LOCAL AREA ALLOYING FOR PREVENTING DISHING OF COPPER DURING CHEMICAL-MECHANICAL POLISHING (CMP)

(75) Inventors: Sudhanshu Misra; Pradip Kumar Roy, both of Orlando, FL (US)

(73) Assignee: Agere Systems Guardian Corp., Allentown, PA (US)

( * ) Notice: Subject to any disclaimer, the term of this patent is extended or adjusted under 35 U.S.C. 154(b) by 0 days.

(21) Appl. No.: 09/547,132

(22) Filed: Apr. 11, 2000

(51) Int. Cl.[7] .............................................. B24B 7/22
(52) U.S. Cl. .......................................... 451/41; 451/29
(58) Field of Search .............................. 451/41, 57, 29, 451/30, 31; 438/626, 692, 618, 622, 674, 675, 680

(56) References Cited

U.S. PATENT DOCUMENTS

| | | | |
|---|---|---|---|
| 5,380,546 A | * 1/1995 | Krishman et al. | ....... 427/126.1 |
| 5,607,718 A | 3/1997 | Sasaki et al. | |
| 5,618,381 A | 4/1997 | Doan et al. | |
| 5,676,587 A | 10/1997 | Landers et al. | |
| 5,775,980 A | 7/1998 | Sasaki et al. | |
| 5,893,752 A | 4/1999 | Zhang et al. | |
| 6,083,835 A | * 7/2000 | Shue et al. | .................. 438/687 |
| 6,242,805 B1 | * 6/2001 | Weling | ........................ 257/752 |
| 6,258,711 B1 | * 7/2001 | Laursen | ........................ 438/633 |

* cited by examiner

Primary Examiner—Robert A. Rose
(74) Attorney, Agent, or Firm—Fay, Sharpe, Fagan, Minnich & McKee, LLP

(57) ABSTRACT

According to the present invention, the dishing of copper during chemical mechanical polishing (CMP) process can be significantly reduced, and in most instances eliminated, by the use of electroplated alloys of copper whereas the alloying metal forms a continuous solid solution with the copper. By forming electroplated alloys of copper with metals that form continuous solid solutions therewith, a deposition layer of such an alloy on the surface of a barrier metal layer allows for lowering the selectivity of the slurry polish used during the CMP process towards the alloy. The alloys of copper with metals that form a continuous solid solution in an electroplating process changes the oxidation characteristics, mechanical properties, electrical properties, stiffness parameters and hardness parameters of the copper. The change in these properties allows the alloy layer and barrier layer to be polished at an equivalent rate until the entire barrier layer has been polished. In this manner, dishing of the copper in the trenches of a wafer from the CMP process can be avoided.

22 Claims, 3 Drawing Sheets

LOCAL AREA ALLOYING FOR PREVENTING DISHING OF COPPER DURING CHEMICAL-MECHANICAL POLISHING (CMP)

FIELD OF THE INVENTION

The disclosed invention relates to the field of integrated circuit semiconductor manufacture. More specifically, a procedure is disclosed for prevention of the phenomena of dishing of copper which occurs during chemical-mechanical polishing (CMP) of copper.

BACKGROUND OF THE INVENTION

Metal films are used for a variety of purposes in the fabrication of integrated circuits. For example, it is well-known that metal films may be used to form interconnective lines, contacts and other conductive features on and above the surface of a semiconductor wafer.

In recent years, there has been a growing interest in the use of copper and copper alloys for metallization in integrated circuits. Copper has some characteristics that make it a particularly attractive candidate for metal features. In particular, copper has a lower resistivity than aluminum alloys, and copper is not as susceptible to electromigration as aluminum alloys are.

Semiconductor fabrication generally comprises providing tungsten or copper wiring or metallization in discrete layers of dielectric oxide film. Oxides typically used to form these film layers include phosphosilicate glass (PSG), borophosphosilicate glass (BPSG) or silicon dioxide ($SiO_2$). The oxide layer is then planarized using conventional planarization techniques. Thereafter, the oxide layer is etched or otherwise processed to pattern a series of trenches and holes therein. A thin barrier layer is then deposited over the oxide layer. The barrier layer generally comprises thin films of titanium (Ti) and titanium nitride (TiN) disposed over one another to form a Ti/TiN stack, or tantalum (Ta) and tantalum nitride (TaN) to form a Ta/TaN stack. Such a barrier layer is commonly deposited by physical vapor deposition (PVD), otherwise known as sputter deposition, or it may be deposited by a chemical vapor deposition (CVD) to form a more conformed coating. Accordingly, the barrier layer serves to coat the surfaces of the trenches and holes as well as the upper surface of the oxide layer and is used to provide good adhesion between the metallization layer and the oxide layer. The metallization is then provided by depositing a layer of conductive material, such as tungsten (W) or copper (Cu), over the barrier layer, wherein the W or Cu will completely fill the trenches and holes. The filled trenches thus form lines, damascene, or a "global wiring layer" while the filled holes comprise studs or vias, also known as "local interconnects". Fabrication of the wiring layer is then completed by removing the barrier layer and the tungsten or copper layer from the surface of the oxide film. This is typically accomplished by the use of a planarization technique.

There are numerous known methods of planarizing wafers during fabrication of integrated circuits, for example, block resist and resist etch back, block resist and spin on glass, etc. A method of choice is chemical mechanical polishing (CMP). CMP provides full wafer planarization. However, one of the difficulties encountered with CMP for trench planarization is the "dishing" effect which occurs in trenches typically of a fully recessed field structure and is related to mechanical polishing of Cu (elastic and plastic). "Dishing" is particularly severe in wide trenches and the "dishing" effect during polishing results in thinning of the dielectric material in wide trenches resulting in dielectric erosion.

One method of forming semiconductors/integrated circuits involves a process known as a damascene process. A damascene process produces conductive interconnects and other features which are directly defined by chemical mechanical polishing. A conventional damascene process begins by forming a dielectric, such as oxide, over a wafer substrate. The dielectric is patterned, for example using lithography to form a photo-resist layer. Troughs are formed in the dielectric defined on two sides by the dielectric and on the bottom by the substrate or a barrier layer. Typically, the barrier layer is also formed on the two side walls of the trough. A conformal blanket layer of conductive material such as copper or tungsten is deposited over the wafer surface. Finally, the wafer surface is polished thereby removing the conductive material overburden while leaving the conductive material in the planar dielectric surface.

In a typical single or dual damascene structure, dishing of copper is a consequence of different polish rates during CMP due to pattern density variations across the substrate. This causes certain areas on the chip where copper is completely removed exposing the underneath barrier layer (typically Ta or TaN) to the polishing slurry, whereas certain other areas still have copper remaining over the substrates surface. In the attempt to completely polish off both the copper and barrier layer, the exposed copper over the trench areas gets over-polished. This over-polish causes dishing of copper.

A related problem of "erosion" occurs when there is an excessive loss of the dielectric film (underneath the barrier) due to over-polish during CMP in an attempt to completely remove the barrier layer. Both dishing and erosion are severe problems facing CMP today. Much, effort has been directed to modify the polish process, equipment and materials in attempting to reduce and control the dishing effect.

The above process is more clearly depicted in FIGS. 2A–2C. Trenched regions 22 are defined in the substrate by a conventional method such as photoengraving, anisotropic etching, or other conventional etching and engraving techniques. A barrier layer 24 of a refractory metal (or a refractory metal complex) such as titanium, titanium nitride, tungsten, tungsten nitride or a complex thereof, is usually formed on the surface of the substrate to provide an adhesive layer for the conductive copper material, shown as layer 26, which is deposited thereon. Optionally, a seed layer (not shown) of the conductive material (such as copper) is deposited on the barrier layer to enhance the adhesion of the conductive material.

In order to make a finalized product, the excess copper extending above the trench or vias, along with the barrier layer deposited on the top surface of the substrate, requires removal leaving a planar surface on the wafer substrate while the trench remains filled with the conductive material. A planarization technique, such as a chemical mechanical polishing (CMP) process is utilized to remove of the excess copper and barrier layer.

Chemical Mechanical Polishing is a semiconductor planarization technique that uses a chemical slurry, along with a polishing pad, to "planarize" or remove discontinuities along the surface of an in-process semiconductor wafer. In chemical mechanical polishing, mechanical movement of a polishing pad relative to the wafer in the presence of an abrasive provides mechanical stress which is combined with a chemical process to selectively remove exposed portions of the surface of the wafer. The slurry serves multiple roles; namely, it is the medium in which the abrasive particles is dispersed, and secondly it furnishes the chemical agents which promote the chemical process. In order for optimum results in chemical mechanical polishing, a synergistic relationship between the chemical and mechanical processes typically exists.

In the prior art, a chemical mechanical polishing process is used to effectuate removal of the upper portion of the copper layer 26, as shown in FIG. 2B, leaving the barrier layer 24 and a portion of the copper layer 26 above the top surface of the substrate 20. In attempting to form a planar surface of the substrate 20, the barrier layer 24 and a portion of the copper remaining above the top edge of the trench 22 is polished by CMP. It is during this polishing phase that dishing (shown at 27) of the copper remaining in the trench occurs as shown in FIG. 2C, resulting in a non-planar surface. This is due to the difference in hardness between the barrier layer, which is relatively hard compared to the copper, causing the barrier layer to polish at a slower rate than the copper. As the CMP polishing pad pushes down on the surface being polished, the copper is polished quicker relative to the barrier layer, thereby forming an uneven surface as the barrier layer is removed.

In order to address the prior art problem of dishing as described above, a process according to the present invention, as shown in FIGS. 3A–3F is utilized thereby reducing, or even eliminating, the dishing phenomenon.

SUMMARY OF THE INVENTION

The present invention is directed to addressing the problem of dishing of copper during chemical-mechanical polishing (CMP) to provide a planarized surface in the manufacture of integrated circuits/semi-conductors.

According to the present invention, the dishing of copper during chemical mechanical polishing (CMP) can be significantly reduced, and in some instances eliminated, by the local area deposition of a copper alloy. The copper alloy may be formed from copper and a metal which forms a continuous solid solution with the copper. By forming alloys of copper with metals that form continuous solid solutions therewith, a local area deposition layer of such an alloy on the surface of a barrier metal layer over a recessed area filled with a conductive material allows for lowering the selectivity of the slurry polish used during the CMP process towards the conductive material. The alloys of copper with metals that form a continuous solid solution therewith is thought to change the oxidation characteristics, mechanical properties, electrical properties, stiffness parameters and hardness parameters of the copper. The change in these properties may allow the alloy layer to be polished at a more equivalent rate to the barrier layer than a non-alloy copper layer. In this manner, dishing of the copper in the recessed areas (trenches) of a semiconductor or integrated circuit (or similar device) from the CMP process can be avoided as the polish rates between the barrier layer and the copper alloy approach a 1:1 ratio.

Additional advantages and objects of the invention will be realized upon a reading of the following detailed description taken in conjunction with the drawings contained herein.

BRIEF DESCRIPTION OF THE DRAWINGS

Embodiments of the invention will now be described by way of reference to the accompanying drawings in which.

It should be emphasized that the drawings of the instant application are not to scale but are merely schematic representation and are not intended to portray the specific parameters or the structure details of the invention which can be determined by one skilled in the art upon a complete reading of the entire application.

DETAILED DESCRIPTION OF THE INVENTION

Figure 1:
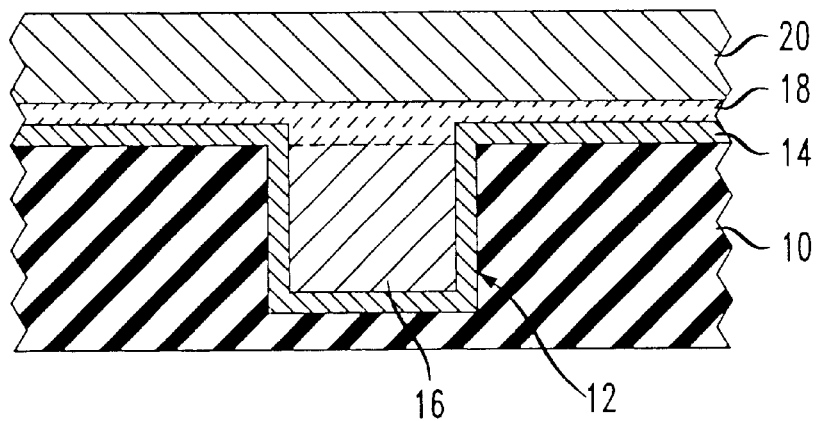
FIG. 1 shows a cross-sectional view of a wafer according to the present invention prior to CMP.
Figure 2A:
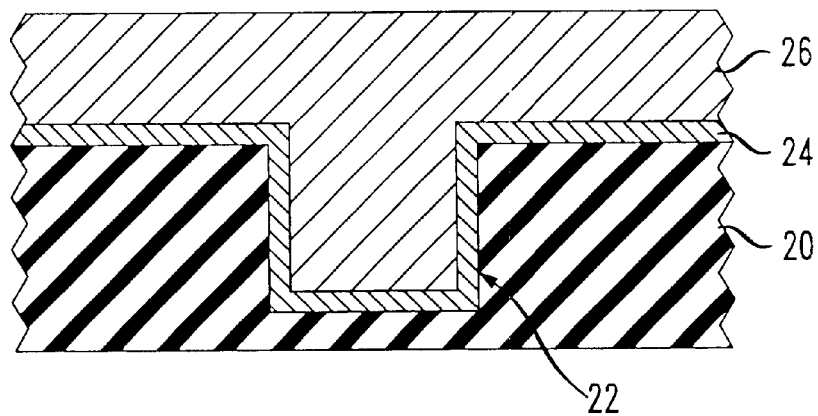
FIG. 2A shows a prior art wafer prior to CMP.
Figure 2B:
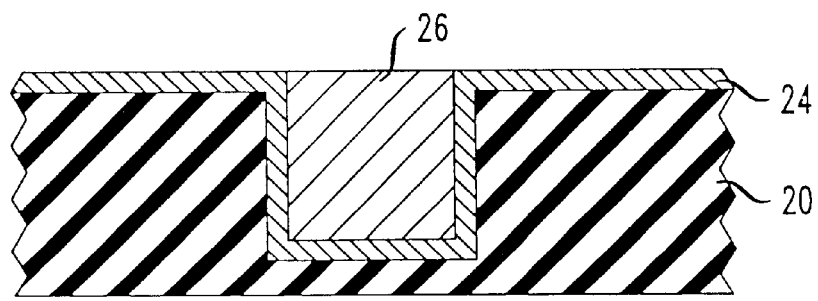
FIGS. 2B and 2C show a prior art wafer during and after CMP wherein CMP results in dishing.
Figure 2C:
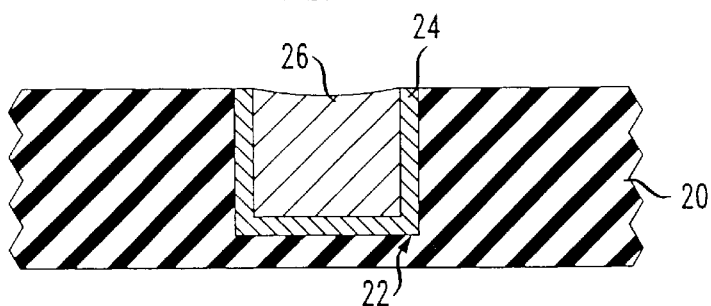

In a method of forming a planarized surface on a wafer for an integrated circuit/semiconductor according to the present invention, a layered wafer, as shown in FIG. 1 is subjected to a chemical-mechanical polishing (CMP) process to form a planarized surface. As shown in FIG. 1, a substrate wafer 10 is provided with a recessed portion (i.e., a trench) 12 which is coated with barrier layer 14 and filled with a conductive material (i.e., copper) 16 having a copper alloy layer locally deposited thereon 18. Optionally, a copper layer 20 is further deposited on the copper alloy layer to cover the remaining areas of the wafer not subject to the local deposition of the alloy, if present.

Figure 3A:
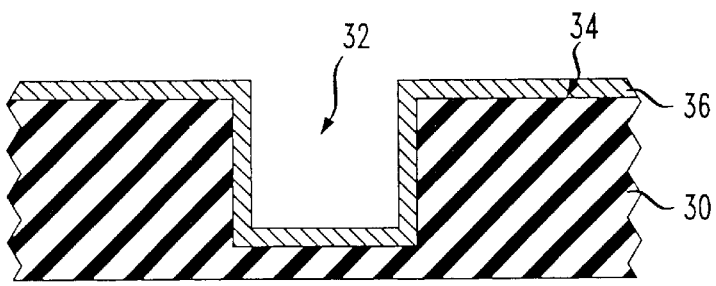
FIGS. 3A to 3F show the formation of a planarized surface on a wafer utilizing the process according to the present invention.
Figure 3B:
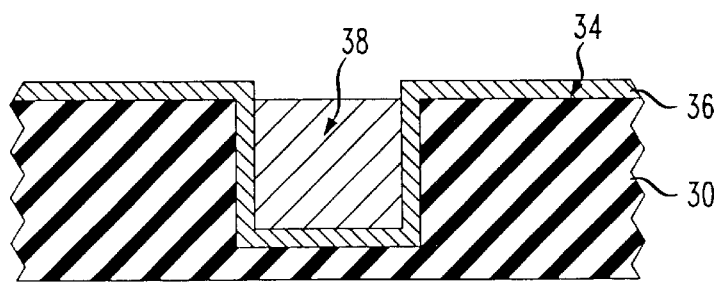

In the process according to the present invention, as shown in FIGS. 3A–3F, a substrate wafer 30 is provided. A recessed portion 32 is formed in the substrate by a conventional process such as photoengraving, anisotropic etching, or other conventional means. A barrier layer 36 of a refractory metal or a complex thereof, such as titanium, titanium nitride, tantalum or tantalum nitride, is formed on the surface 34, of the substrate 30. The barrier layer 36, which is typically 50Å to 500Å in thickness, more typically 100Å–250Å in thickness, may also provide an adhesive layer for the conductive copper material, shown as 38 in FIG. 3B, which is deposited within the trenched area 32, having the barrier layer coated thereon. As shown in FIG. 3B, the copper layer 38 is deposited so as to fill the trench to a level approaching the top surface of the underlying wafer. Optionally, a thin seed layer (not shown) of the conductive material can be formed on the barrier layer 36 to enhance adhesion of the conductive material.

Figure 3C:
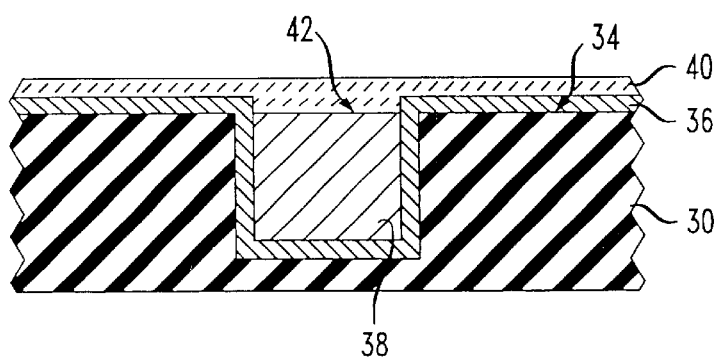

At this point, the process of the present invention involves a novel step of formation of a copper alloy layer 40 via deposition of a copper alloy layer on the top surface of the structure as shown in FIG. 3C. The deposition of the copper alloy may be by electroplating, vapor deposition (physical or chemical), or other conventional deposition techniques. The copper alloy is of the formula Cu—M wherein M is typically a metal which forms a continuous solid solution with the copper. The metal M is selected from metals such as Ni, Zn, Si, Au, Ag, Al, Cr, Mn, Pd, Pb, Sn, or blends thereof. The metal M may be present in an amount of up to about 70 wt.% of the alloy, typically at about 10 wt.% to about 40 wt.% of the alloy, more typically in an amount of about 30 wt.% of the alloy. The amount of metal M in the alloy is adjusted so that the hardness of the alloy approaches or matches the hardness of the barrier layer. Typically the thickness of the alloy is between about 200Å to about 1,000Å, more typically between about 500Å to about 800Å. The thickness of the alloy is designed so that, upon polishing via CMP, the polishing can stop when the underlying dielectric layer becomes exposed.

Figure 3D:
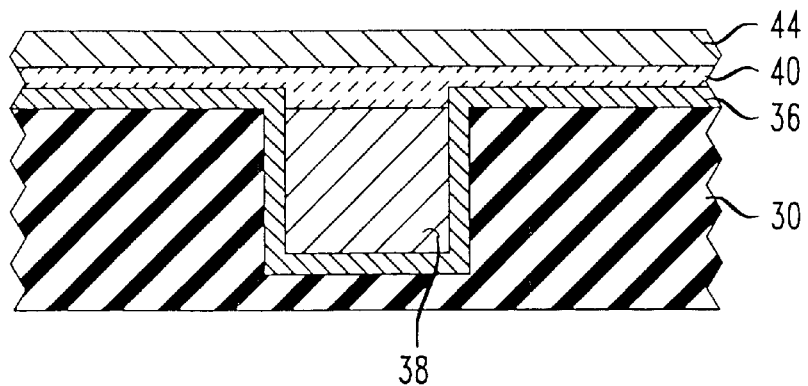

Optionally, in a final layering step, a copper layer 44 is then deposited atop the copper alloy layer 40 as shown in FIG. 3D. This optional step is present when the local deposition of the alloy over the recessed portion would leave other portions of the wafer below the level of the alloy layer 40.

Figure 3E:
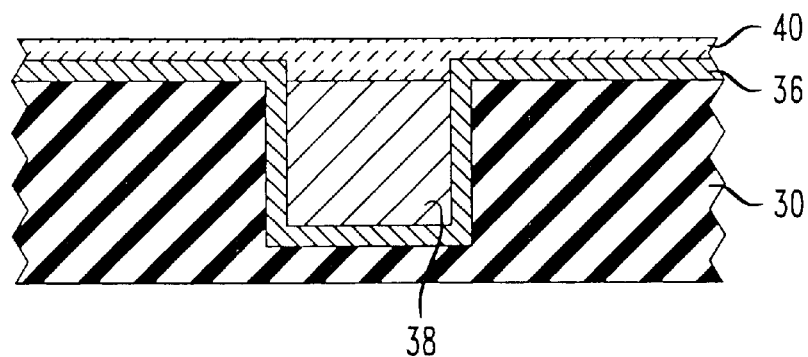
Figure 3F:
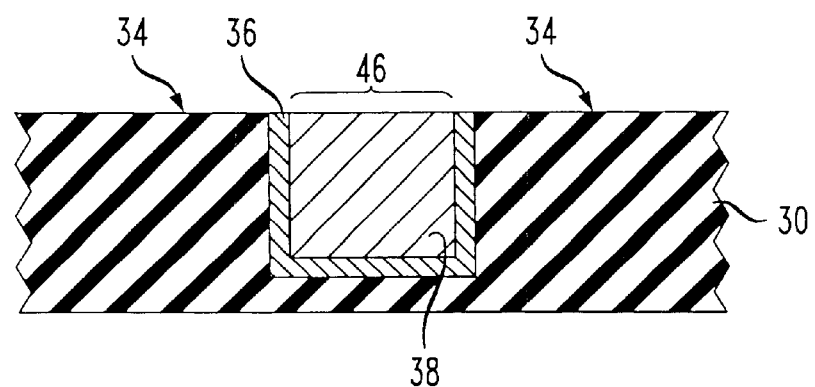

As in the prior art process, a CMP process is used to effectuate removal of the copper layer 44, as shown in FIG. 3E (layer 44 removed). Subsequently, the copper alloy layer 40 and barrier layer 36 are polished thereby forming a planar surface 34 on the substrate 30 as shown in FIG. 3F. According to the present invention, the polishing of the Cu—M alloy 40 and barrier layer 36 is modulated so that both of the layers are polished at nearly the same rate (or, ideally, as close to the same rate as possible). The slurries used in the CMP are those conventionally used in CMP process.

Examples include, but are not limited to Klebosal 1501, Cabot 5512, etc. Residual alloying elements may remain on the surface 46 of the conductive copper conductive material 38. Certain alloying elements which diffuse quickly in copper, such as gold, will most likely leave a fingerprint on the surface of the surface 46 of the copper conductive material 38.

Depicted below in Table 1 are a number of Cu—M alloys in accordance with the present invention.

TABLE 1

| Alloy | wt. % M | Example |
| --- | --- | --- |
| Cu-Zn | ≦40% Zn | 60Cu40Zn |
| Cu-Ni | ≦30% Ni | 70Cu30Ni |
| Cu-Cr | ≦35% Cr | 65Cu35Cr |
| Cu-Mn | ≦20% Mn | 80Cu20Mn |
| Cu-Al | ≦40% Al | 60Cu40Al |
| Cu-Pd | ≦10% Pd | 90Cu10Pd |
| Cu-Ni-Zn | ≈15–25% Ni, ≈15–30% Zn | 65Cu18Ni17Zn, 55Cu18Ni27Zn |

Other metal alloys, include but are not limited to, Cu—Au, Cu—Zn—Pb, Cu—Zn—Sn, Cu—Sn—Pb and other copper/metal alloys which form a continuous solid solution with the copper (i.e., a Cu—Pd alloy where Pd is present at ≧70 %). The amount of metal in the alloy can be adjusted so that the polishing with the barrier layer approaches a 1:1 ratio.

In a preferred embodiment, a Cu—Ni alloy layer, having about 30 wt.% Ni is formed atop the barrier layer, such as a Ti or Ta containing barrier layer, via an electroplating method. This Cu—Ni layer, when polished via CMP along with the barrier layer at a 1:1 ratio, reduces dishing of the copper in the trenches as described herein before.

Although particular embodiments of the invention have been described in detail, it should be appreciated that numerous modifications, variations and adaptations may be made without departing from the scope of the invention as defined in the claims.

In the claims:

1. A method of manufacturing an integrated circuit comprising the steps of:
providing a substrate having a surface, wherein the substrate has a recessed portion defined in the surface;
depositing copper in the recessed portion defined in the substrate;
providing a copper alloy layer over the surface of the copper wherein the copper alloy is of the formula Cu—M and M is selected from the group consisting of Ni, Zn, Si, Au, Ag, Al, Mn, Pd, Pb, Sn, or blends thereof; and,
planarizing the resulting structure.

2. The method of claim 1 wherein a barrier layer. is formed on the recessed portion of the surface prior to the copper deposition step further wherein in said copper deposition step, the copper is deposited to a level up to the surface of the substrate.

3. The method of claim 2, wherein the barrier layer is formed from at least one refractory metal, alone or combined with nitrogen.

4. The method of claim 3, wherein the barrier layer is formed from at least one of Ti, TiN, Ta or TaN.

5. The method of claim 1 wherein the planarization step is performed by chemical mechanical polishing.

6. The method of claim 1, wherein the amount of copper alloy is that which is sufficient to prevent dishing of copper deposited in the recessed portion of the substrate.

7. The method of claim 2 wherein the copper alloy layer extends above the barrier layer.

8. The method of claim 6, wherein the copper alloy layer is from about 200 to about 1,000 angstroms thick.

9. The method of claim 6, wherein the copper alloy layer is from about 500 to about 800 angstroms thick.

10. A chemical mechanical polishing method to minimize dishing of copper comprising the steps of:
providing a substrate having a surface, wherein the substrate has a recessed portion defined in the surface;
forming a barrier layer from a barrier material on the substrate, including the surface and the recessed portion defined therein, wherein the barrier material contains titanium or tantalum;
depositing a copper film on said barrier layer portions on the surface of the substrate and filling the recessed portion defined in the substrate with copper to a level up to the surface of the substrate;
providing a copper alloy layer of the formula, Cu—M wherein M is selected from Ni, Zn, Al, Sn, Pb, Mn, Au, or complexes thereof, on the surface of the copper to a thickness which extends the alloy above the barrier layer on surface of the substrate;
planarizing the resulting structure by a step of chemical mechanical polishing to remove all parts of each of the layers extending above the substrate's surface thereby resulting in a planar surface over the substrate.

11. The method of claim 1, wherein the metal M is present in an amount of up to 70 wt.% of the alloy.

12. The method of claim 1, wherein the metal M is present in an amount of from about 10 wt % to about 40 wt.% of the alloy.

13. The method of claim 1, wherein the metal, M, is Ni.

14. The method of claim 13, wherein the Ni is present in an amount of from about 10 wt.% to about 40 wt.% of the alloy.

15. The method of claim 13, wherein the Ni is present in an amount of about 30 wt.% of the alloy.

16. The method of claim 1, wherein the metal, M, is a Ni, Zn blend.

17. The method of claim 16, wherein the Ni is present in an amount of about 15 wt.% to about 25 wt.% of the alloy and the Zn is present in an amount of about 15 wt.% to about 30 wt.% of the alloy.

18. The method of claim 16 wherein the alloy is selected from the group consisting of 65Cu18Ni17Zn and 55Cu18Ni27Zn.

19. The method of claim 1, wherein the alloy is selected from the group consisting of Cu—Ni, Cu—Zn, Cu—Zn—Pb, Cu—Zn—Sn, Cu—Sn—Pb, Cu—Ni—Zn, Cu—Al, Cu—Au, Cu—Mn, and Cu—Pd.

20. A semiconductor formed according to the method claim 1.

21. The process of claim 10, wherein in the Cu—M alloy is Cu—Ni, further wherein Ni is present at about 30 wt.% of alloy.

22. A semiconductor formed according to the method of claim 10.

* * * * *